(12) United States Patent
Sun et al.

(10) Patent No.: US 11,265,407 B2
(45) Date of Patent: Mar. 1, 2022

(54) DISPLAY SCREEN AND MOBILE TERMINAL

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Kuo Sun, Beijing (CN); Haijun Yin, Beijing (CN); Yang Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 527 days.

(21) Appl. No.: 16/336,942

(22) PCT Filed: Aug. 15, 2018

(86) PCT No.: PCT/CN2018/100619
§ 371 (c)(1),
(2) Date: Mar. 27, 2019

(87) PCT Pub. No.: WO2019/114302
PCT Pub. Date: Jun. 20, 2019

(65) Prior Publication Data
US 2021/0360097 A1    Nov. 18, 2021

(30) Foreign Application Priority Data
Dec. 13, 2017    (CN) .......................... 201711330105.3

(51) Int. Cl.
*H04M 1/02* (2006.01)
*G06F 1/16* (2006.01)
(Continued)

(52) U.S. Cl.
CPC ........ *H04M 1/0268* (2013.01); *G06F 1/1626* (2013.01); *H01L 27/323* (2013.01);
(Continued)

(58) Field of Classification Search
CPC ............... H04M 1/0268; H04M 1/035; H04M 2250/22; G06F 1/1626; H01L 27/323;
(Continued)

(56) References Cited

U.S. PATENT DOCUMENTS 10,015,574 B1 * 7/2018 Luce ...................... H04R 1/025
10,021,800 B1 * 7/2018 Zhang .................... H05K 5/068
(Continued)

FOREIGN PATENT DOCUMENTS

| CN | 104954519 A | 9/2015 |
| CN | 204650470 U | 9/2015 |
| CN | 107786696 A | 3/2018 |

OTHER PUBLICATIONS

Search Report and Written Opinion for International Application No. PCT/CN2018/100619 dated Nov. 6, 2018.

*Primary Examiner* — Abhishek M Rathod
(74) *Attorney, Agent, or Firm* — Calfee, Halter & Griswold LLP

(57) ABSTRACT

A display screen including a display panel, a cover plate and an exciter for generating vibration. The cover plate covers an upper surface of the display panel. The cover plate is provided with a first micropore array, and an area covered by the first micropore array forms a speaker area. The exciter for generating vibration is arranged under the display panel aligned with the speaker area.

13 Claims, 2 Drawing Sheets

(51) Int. Cl.
*H04M 1/03* (2006.01)
*H01L 51/52* (2006.01)
*H01L 27/32* (2006.01)

(52) U.S. Cl.
CPC ...... *H01L 27/3244* (2013.01); *H01L 51/5293* (2013.01); *H04M 1/035* (2013.01); *H01L 2251/5338* (2013.01); *H04M 2250/22* (2013.01)

(58) Field of Classification Search
CPC ............. H01L 27/3244; H01L 51/5293; H01L 2251/5338
See application file for complete search history.

(56) References Cited

U.S. PATENT DOCUMENTS

| | | | | |
|---|---|---|---|---|
| 10,103,351 B1* | 10/2018 | Li | ...................... | H01L 27/3276 |
| 10,594,845 B2* | 3/2020 | Hebert | .................. | G06F 1/1626 |
| 11,076,664 B1* | 8/2021 | Podhajny | ............. | D03D 25/005 |
| 2013/0329173 A1* | 12/2013 | Jung | .................... | H05K 9/0054 |
| | | | | 349/122 |
| 2014/0219646 A1* | 8/2014 | Hooton | .................. | G03B 15/03 |
| | | | | 396/176 |
| 2014/0282059 A1* | 9/2014 | Oh | .......................... | G06F 13/20 |
| | | | | 715/744 |
| 2015/0110308 A1* | 4/2015 | Tai | ...................... | G06F 3/03547 |
| | | | | 381/182 |
| 2015/0280770 A1* | 10/2015 | Rhee | ................. | H04M 1/72412 |
| | | | | 455/575.8 |
| 2016/0197637 A1* | 7/2016 | Lee | ......................... | A45C 11/00 |
| | | | | 455/566 |
| 2016/0368539 A1* | 12/2016 | Schwarz | ............... | B32B 27/304 |
| 2017/0149942 A1* | 5/2017 | Lee | ..................... | H04M 1/0277 |
| 2017/0150618 A1* | 5/2017 | Choi | .................... | H05K 5/0017 |
| 2018/0090720 A1* | 3/2018 | Hack | ........................ | H01L 51/56 |
| 2018/0147810 A1* | 5/2018 | Cheon | .................... | B32B 3/266 |
| 2018/0166809 A1* | 6/2018 | Brogan | ................. | G06F 1/1658 |
| 2018/0191930 A1* | 7/2018 | Jeong | .................. | H04N 5/2252 |
| 2019/0027807 A1* | 1/2019 | Choi | ...................... | H01Q 1/243 |
| 2019/0027808 A1* | 1/2019 | Mow | ...................... | H04R 1/025 |
| 2020/0201386 A1* | 6/2020 | Hwang | .................... | H05K 5/04 |

* cited by examiner

DISPLAY SCREEN AND MOBILE TERMINAL

CROSS REFERENCE TO RELATED APPLICATIONS

This application is a 35 U.S.C. § 371 national stage application of a PCT International Application No. PCT/CN2018/100619, filed on Aug. 15, 2018, which claims the priority of a Chinese patent application No. 201711330105.3 filed on Dec. 13, 2017, the entire contents of which are hereby incorporated by reference.

TECHNICAL FIELD

The present disclosure relates to the technical field of displays, in particular to a display screen and a mobile terminal.

BACKGROUND

With the increasing demand for aesthetic appearance and performance of mobile terminals such as mobile phones and tablet computers, full-screen mobile terminals with good visual effects have gradually become the main development trend. As the full screen needs to make the screen proportion of the mobile terminal as large as possible, even covering the entire front face of the mobile terminal, the screen will cover the location where the speaker is typically installed in the mobile terminal, resulting in no place to install the speaker, affecting the sound generation of the mobile terminal when the user uses the speaker function, and degrading the user's experience in using the mobile terminal. At present, the method for mobile terminals on the market to solve the problem of full-screen sound generation when users use the speaker function is to use the principles of solid-state vibration and bone conduction for sound generation and sound transmission, so that sound is transmitted to users through the ear bones of users. The structure and method are equivalent to sound transmission through the screen of the full-screen mobile terminal, and the full screen itself does not have a speaker structure. Because when the bone conduction method is used for sound transmission, the sound will be transmitted through the air and the user's ear bone respectively, and the proportion of air transmission is larger than that of the bone transmission. Therefore, when the full-screen mobile device with this structure is used, the outgoing sound when the user uses the speaker function will be very loud, so that other people besides the user can also hear the sound emitted by the mobile terminal, thus affecting the privacy of the iii user and degrading the user's experience in using the mobile terminal.

As the full-screen mobile terminal requires a large outgoing sound and thus, a low degree of privacy when using the speaker function, in order to obtain a better use effect and user experience so that the full-screen mobile terminal can have low outgoing sound when using the speaker function and to better protect the privacy of the user, it is necessary to provide a display screen which is applicable to a full-screen mobile terminal which does not affect the aesthetic appearance while having a speaker structure. It is also necessary to provide a mobile terminal having such display screen.

SUMMARY

In view of this, an exemplary embodiment of the present disclosure provides a display screen which comprises:

a display panel;

a cover plate covering an upper surface of the display panel, wherein the cover plate is provided with a first micropore array, and the area covered by the first micropore array forms a speaker area; and, an exciter for generating vibration to form sound which is arranged under the display panel, and aligned with the speaker area.

Further, in an exemplary embodiment, the display panel is an AMOLED (Active Matrix Organic Light Emitting Diode) display panel.

Further, in an exemplary embodiment, the AMOLED display panel comprises: a flexible panel; a polarizer covering an upper surface of the flexible panel; and a touch panel covering an upper surface of the polarizer.

Furthermore, in an exemplary embodiment, the touch panel is provided with a second micropore array, the polarizer is provided with a third micropore array, and the positions of the second micropore array and the third micropore array respectively correspond to that of the first micropore array.

Further, in an exemplary embodiment, micropore diameters of the second micropore array and the third micropore array are respectively equal to a micropore diameter of the first micropore array.

Furthermore, in an exemplary embodiment, it also includes a base plate covering a lower surface of the display panel.

Optionally, in an exemplary embodiment, the exciter is fixed to a lower surface of the base plate.

Optionally, in an exemplary embodiment, the base plate is provided with a mounting hole, the mounting hole is aligned with the speaker area, and the exciter is disposed in the mounting hole and fixed to the lower surface of the display panel.

Furthermore, in an exemplary embodiment, the base plate is provided with a fourth micropore array, and the position of the fourth micropore array corresponds to that of the first micropore array.

In addition, in an exemplary embodiment, a micropore diameter of the fourth micropore array is 5-20% larger than that of the first micropore array.

Optionally, in an exemplary embodiment, the micropore diameter of each of the first micropore array, the second micropore array, and the third micropore array is 10-500 microns.

In an exemplary embodiment, mobile terminal of the present disclosure comprises a terminal body and a full screen arranged on the terminal body, wherein the full screen comprises the display screen described above.

DETAILED DESCRIPTION

In the following, the structure and working principle of the present disclosure will be further explained with reference to the attached drawings.

Figure 1:
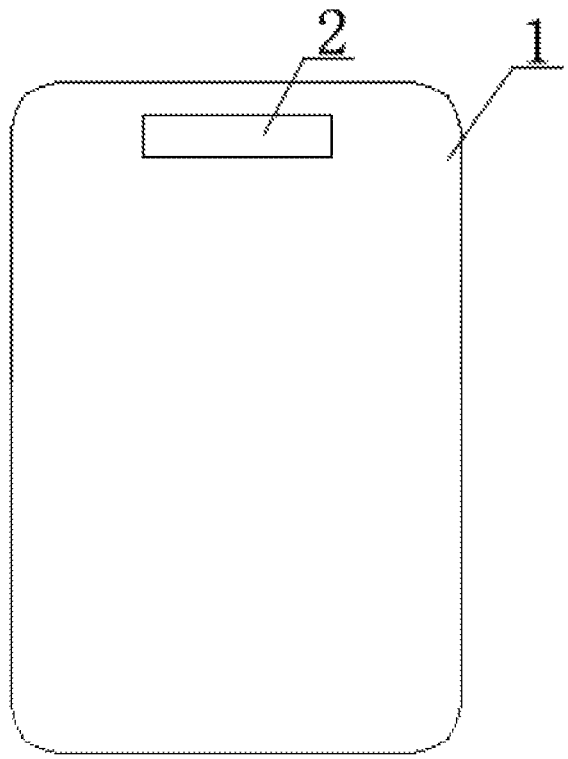
FIG. 1 is a front view of a display screen according to an exemplary embodiment.
Figure 2:
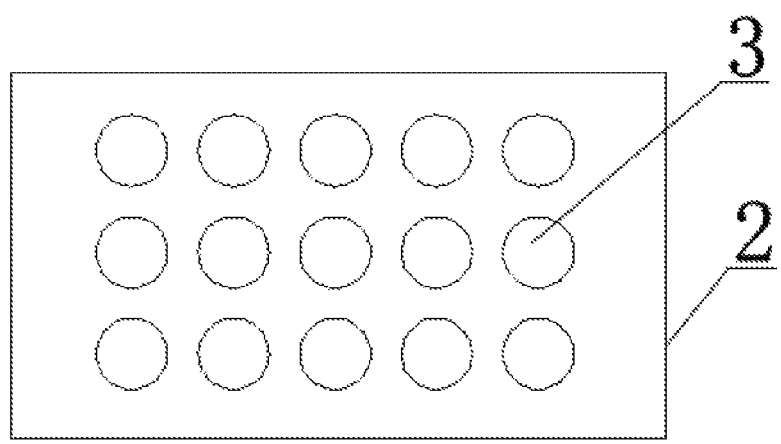
FIG. 2 is a schematic structural view of a speaker area of a display screen according to an exemplary embodiment.

As shown in FIG. 1, the present disclosure is a display screen having a speaker structure. A speaker area 2 of the display screen is located in the screen area. The speaker area 2 does not have a rectangular frame shown in the figure, and the rectangular frame is only a schematic frame for the convenience of illustration. The speaker area 2 is formed by a micropore array 3 arranged in the surface of the display screen 1. As shown in FIG. 2, the micropore array 3 may include a plurality of micropores. The micropores may form a rectangular array shown in the figure, or may be designed into other shapes, such as a circular array, a polygonal array, a semicircular array, etc. In exemplary embodiments, the micropore array 3 is used as a sound propagation channel. As the pore diameter of the micropore array 3 for sound propagation is very small, the micropores in the screen cannot be easily detected by the naked eye of a user, therefore, the visual effect of the display screen 1 will not be affected, and the aesthetic appearance of the screen can be maintained.

Figure 3:
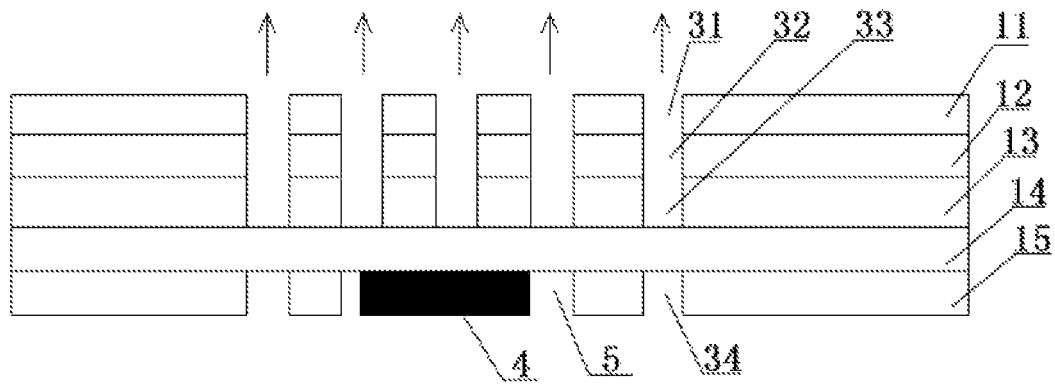
FIG. 3 is a cross-sectional view of a display screen according to an exemplary embodiment.

As shown in FIG. 3, the display screen 1 includes a display panel, a cover plate 11 covering an upper surface (display surface) of the display panel, and a base plate 15 covering a lower surface of the display panel. The cover plate 11 and the base plate 15 are both protective layers for the display panel. The cover plate 11 may be a glass cover plate. In addition, the base plate 15 also has shielding, heat dissipating and cushioning functions.

In this exemplary embodiment, the display panel may be an AMOLED display panel. The AMOLED display panel includes a flexible panel 14, a polarizer 13 covering an upper surface of the flexible panel 14, and a touch panel 12 covering an upper surface of the polarizer 13. As for display, the AMOLED display panel has a wider color gamut and a higher contrast. Moreover, the AMOLED display panel does not need backlight, color filter, backlight module and liquid crystal material because of its self-luminous principle, so it is lighter and thinner. Moreover, each pixel of the AMOLED display screen can be controlled independently without constant backlight, so the energy consumption is lower. Therefore, the display screen 1 of this exemplary embodiment can be made smaller and thinner, with a wider color gamut, higher contrast, and lower energy consumption.

In the illustrated exemplary embodiment, the cover plate 11 is provided with a first micropore array 31, and the area covered by the first micropore array 31 forms a speaker area 2. In addition, the touch panel 12 is further provided with a second micropore array 32, the polarizer 13 is further provided with a third micropore array 33, and the base plate 15 is further provided with a fourth micropore array 34, wherein the positions of the second micropore array 32, the third micropore array 33, and the fourth micropore array 34 respectively correspond to that of the first micropore array 31. According to the display screen 1 of this exemplary embodiment, since the micropore matrices 3 are provided in all layers except the flexible panel 14, the speaker structure can have a better sound transmission effect, thereby improving the sound transmission quality and further improving the user experience.

In order to facilitate the manufacture of the display screen 1, reduce production cost and improve production efficiency, the micropore diameters of the second micropore array 32 and the third micropore array 33 in this exemplary embodiment are respectively equal to the micropore diameter of the first micropore array 31, and the micropore diameter of the fourth micropore array 34 is 5-20% larger than that of the first micropore array 31. Therefore, during the screen production, the cover plate 11, the touch panel 12 and the polarizer 13 can be attached together first, then the cover plate 11, the touch panel 12 and the polarizer 13 can be perforated together to form the corresponding micropore array 3 in each layer respectively, and then the cover plate 11, the touch panel 12 and the polarizer 13 can be attached together on the upper surface of the flexible panel 14. However, the base plate 15 can be separately perforated to form the fourth micropore array 34, and then the base plate 15 is attached to the lower surface of the flexible panel 14. Since the layers covering the upper surface of the flexible panel 14 and the base plate 15 covering the lower surface of the flexible panel 14 are attached respectively, it is necessary to align the fourth micropore array 34 with the other microporous matrices 3 when attaching the base plate 15. Making the micropore diameter of the fourth micropore array 34 in the base plate 15 slightly larger enables the micropores of the first micropore array 31 to be covered by the micropores of the fourth micropore array 34 even though there is a certain error in the alignment (i.e., the micropores are not necessarily completely coaxial) of the micropores of the fourth micropore array 34 and the micropores of the first micropore array 31, without affecting sound propagation. Therefore, this exemplary embodiment can not only perforate the cover plate 11, the touch panel 12, and the polarizer 13 together to reduce the perforating workload during production, but also decreases the accuracy requirement when attaching the base plate 15, thereby reducing the production cost of the display screen 1.

Since an exciter 4 is used to generate vibration, a medium (such as gas, liquid and/or solid, mainly air medium here) generates sound after being vibrated by the exciter 4. In order to enhance the sound transmission effect, the base plate 15 of this exemplary embodiment may also be provided with a mounting hole 5, which is aligned with the speaker area 2 (i.e., the orthographic projection of the mounting hole 5 in the vertical direction overlaps or coincides with the orthographic projection of the speaker area 2 in the vertical direction), for placing the exciter 4 and aligning the exciter 4 with the speaker area 2. Since the exciter 4 is used to generate vibration and each of the micropore matrices 3 is used for propagating sound, all the micropore matrices 3 and the exciter 4 form a speaker structure, so that sound can be propagated to a user in an air propagation mode through micropores, and privacy of the user can be better protected while outgoing sound of the mobile terminal can be decreased. In this exemplary embodiment, the exciter 4 is fixed to the lower surface of the display panel. Therefore, the exciter 4 can be directly attached to the flexible panel 14 of the display panel, so that the flexible panel 14 can also be used as a vibration source to vibrate together with the exciter 4 to improve the vibration intensity of the sound source, thereby improving the sound generation effect of the speaker structure.

Figure 4:
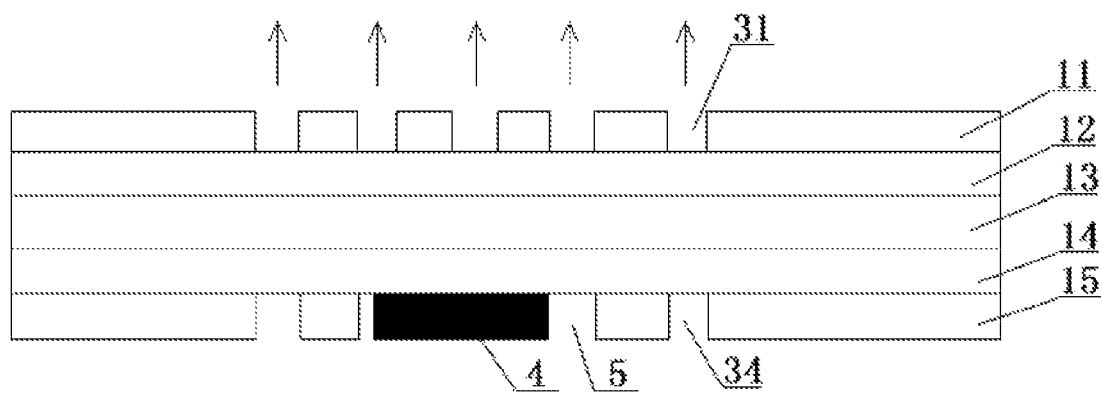
FIG. 4 is a cross-sectional view of a display screen according to another exemplary embodiment.

FIG. 4 is a variation of the display screen shown in FIG. 3. Unlike FIG. 3, the touch panel 12 and the polarizer 13 shown in FIG. 4 are not provided with the micropore matrices 3.

During the screen production, the cover plate 11 and the base plate 15 can be perforated respectively, and then the cover plate 11, the touch panel 12, the polarizer 13, the flexible panel 14 and the base plate 15 can be sequentially attached.

Experiments show that although the display screen 1 shown in FIG. 4 is not as good as the display screen shown in FIG. 3 in sound transmission, it can also transmit sound through the micropore matrices 3, which can also improve the user's speaker use experience. While decreasing the outgoing sound of the mobile terminal, it can prevent the touch accuracy from being affected due to the micropore array 3 arranged in the touch panel 12, and can prevent the polarizing effect from being affected due to the micropore array 3 arranged in the polarizer 13. This can be said to be a compromise solution wherein on the one hand, the sound transmission is considered, and the touch and polarized display effects of the display screen 1 are also considered.

Figure 5:
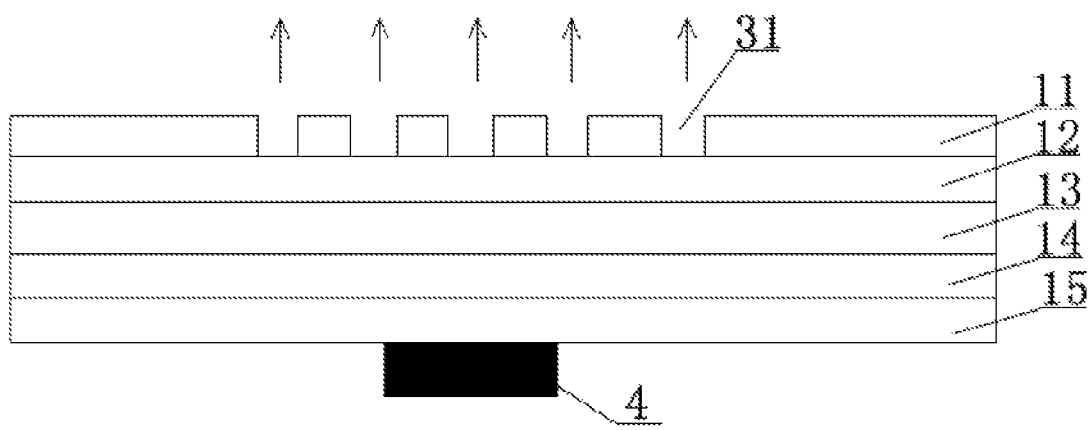
FIG. 5 is a cross-sectional view of a display screen according to yet another exemplary embodiment.

FIG. 5 is a variation of the display screen shown in FIG. 4. Unlike FIG. 4, in the display screen shown in FIG. 5, the base plate 15 is not provided with the micropore array 3 and the mounting hole 5, and the exciter 4 is fixed to the lower surface of the base plate 15 and aligned with the speaker area 2, that is, the orthographic projection of the exciter 4 in the vertical direction overlaps or coincides with the orthographic projection of the speaker area 2 in the vertical direction. As an example, the exciter 4 may be adhered to the lower surface of the base plate 15 through an adhesive tape.

During screen production, the cover plate 11 can be perforated first, and then the cover plate 11, the touch panel 12, the polarizer 13, the flexible panel 14 and the base plate 15 can be sequentially attached.

In the display screen 1 shown in FIG. 5, since the exciter 4 is not directly attached to the flexible panel 14, but is attached to the lower surface of the base plate 15 with greater strength, the mechanical strength of the display screen 1 can also be enhanced. Experiments show that although the display screen 1 shown in FIG. 5 is not as good as the display screen shown in FIG. 4 in sound transmission, it can also transmit sound through the micropore array 3, which can also improve the user's speaker use experience, and can enhance the strength of the entire display screen and reduce the manufacturing cost while decreasing the outgoing sound of the mobile terminal.

For example, the pore diameter of each of the first micropore array, the second micropore array, and the third micropore array is 10-500 microns. The micropore diameter of the fourth micropore array is 5-20% larger than the micropore diameter of the first micropore array, or the pore diameters of the first micropore array and the fourth micropore array are equal to each other.

The present disclosure also discloses a mobile terminal, which comprises a terminal body and a full screen arranged on the terminal body, wherein the full screen can comprise the display screen 1 described above, so that the full screen of the mobile terminal has a speaker structure, so that sound can be transmitted to a user in an air propagation mode through micropores, privacy of the user can be better protected while outgoing sound of the mobile terminal can be decreased, and the mobile terminal has aesthetic appearance and does not affect visual effects.

The display screen and the mobile terminal provided by an exemplary embodiment use a micropore array and an exciter to form a speaker structure, so that sound can be transmitted to a user in an air propagation mode through micropores, outgoing sound of the mobile terminal is decreased, privacy of the user is better protected, and aesthetic appearance of a full screen is maintained.

According to the exemplary embodiment of a display screen, the cover plate is provided with a first micropore array for forming a speaker area, and an exciter is arranged under the display panel at a position corresponding to the speaker area. The first micropore array and the exciter can form a speaker structure, so that sound can be transmitted to a user in an air propagation mode through micropores, and the privacy of the user is better protected while the outgoing sound of the mobile terminal is decreased. According to the display screen of the present disclosure, the micropore array is adopted in the cover plate to transmit sound, so that user cannot easily recognize it by naked eyes, the aesthetic appearance of the screen is maintained, and the visual effect is not affected.

According to a mobile terminal of an exemplary embodiment, using the display screen of the present disclosure, the speaker area of the full screen of the mobile terminal can be provided with a speaker structure, so that sound can be transmitted to a user in an air propagation mode through micropores, privacy is better protected while the outgoing sound of the mobile terminal is decreased, and the visual effect of the full screen is not affected.

The above is only a schematic description of the present disclosure, and those skilled in the art should know that various improvements can be made to the present disclosure without departing from the working principle of the present disclosure, which all fall within the scope of protection of the present disclosure.

It should be noted that the present disclosure uses expressions "one embodiment", "an exemplary embodiment", "an embodiment" or "some embodiments" along with their derivatives, and these expressions and terms mean that a specific feature, structure or characteristic described in connection with the embodiment is included in at least one embodiment. The appearances of the phrase "in one embodiment" in various places in this disclosure are not necessarily all referring to the same embodiment.

Unless otherwise defined, all technical and scientific terms used in this specification have the same meaning as commonly understood by those skilled in the art to which this disclosure belongs. The terms "first," "second," "third," and the like are only used as labels to distinguish elements or steps, and are not intended to impose numerical and order requirements on their objects.

It should be understood that the words "a" or "an" in the claims of the present disclosure do not exclude plural numbers, and are only intended for convenience of description and should not be construed as limiting the scope of protection of the present disclosure.

Although the subject matter has been described in language specific to structural features and/or methodological acts, it should be understood that the subject matter defined in the appended claims is not necessarily limited to the specific features or acts described above. On the contrary, the specific features and acts described above are disclosed as exemplary forms of implementing the claims. Obviously, those skilled in the art can make various changes and modifications to the embodiments of the present disclosure without departing from the spirit and scope of the present disclosure. Thus, if these modifications and variations of the present disclosure fall within the scope of the claims of the present disclosure and their equivalents, the present disclosure is also intended to include these modifications and variations.

The invention claimed is:

1. A display screen comprising:
   a display panel;
   a cover plate covering an upper surface of the display panel, wherein the cover plate is provided with a first micropore array, and an area covered by the first micropore array forms a speaker area;
   an exciter for generating vibration to form sound which is arranged under the display panel and aligned with the speaker area; and
   a base plate covering a lower surface of the display panel, wherein the base plate is provided with a mounting hole, the mounting hole is aligned with the speaker area, and the exciter is disposed in the mounting hole and fixed to a lower surface of the display panel, and wherein the base plate is provided with a fourth micropore array, and a position of the fourth micropore array corresponds to that of the first micropore array.

2. The display screen according to claim 1, wherein the display panel is an AMOLED display panel.

3. The display screen according to claim 2, wherein the AMOLED display panel comprises: a flexible panel, a polarizer covering an upper surface of the flexible panel, and a touch panel covering an upper surface of the polarizer.

4. The display screen according to claim 3, wherein the touch panel is provided with a second micropore array, the polarizer is provided with a third micropore array, and positions of the second micropore array and the third micropore array respectively correspond to a position of the first micropore array.

5. A mobile terminal comprising a terminal body and a full screen arranged on the terminal body, wherein the full screen comprises the display screen as claimed in claim 3.

6. The display screen according to claim 4, wherein micropore diameters of the second micropore array and the third micropore array are respectively equal to a micropore diameter of the first micropore array.

7. A mobile terminal comprising a terminal body and a full screen arranged on the terminal body, wherein the full screen comprises the display screen as claimed in claim 4.

8. A mobile terminal comprising a terminal body and a full screen arranged on the terminal body, wherein the full screen comprises the display screen as claimed in claim 6.

9. A mobile terminal comprising a terminal body and a full screen arranged on the terminal body, wherein the full screen comprises the display screen as claimed in claim 2.

10. The display screen according to claim 1, wherein the exciter is fixed to a lower surface of the base plate.

11. The display screen according to claim 1, wherein a micropore diameter of the fourth micropore array is 5-20% larger than that of the first micropore array.

12. The display screen according to claim 1, wherein a micropore diameter of the first micropore array is 10-500 microns.

13. A mobile terminal comprising a terminal body and a full screen arranged on the terminal body, wherein the full screen comprises the display screen as claimed in claim 1.

* * * * *